(12) United States Patent
Lee et al.

(10) Patent No.: US 7,164,583 B2
(45) Date of Patent: Jan. 16, 2007

(54) MOUNTING DEVICE FOR HEAT SINK

(75) Inventors: Hsieh Kun Lee, Tu-Chen (TW); Wan-Lin Xia, Shenzhen (CN); He-Ben Liu, Shenzhen (CN)

(73) Assignees: Fu Zhun Precision Ind. (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 177 days.

(21) Appl. No.: 10/946,670

(22) Filed: Sep. 21, 2004

(65) Prior Publication Data
US 2005/0083661 A1    Apr. 21, 2005

(30) Foreign Application Priority Data
Oct. 17, 2003  (TW) ............................. 92218492 U

(51) Int. Cl.
H05K 7/20    (2006.01)
(52) U.S. Cl. .................. 361/704; 361/695; 361/719; 257/718; 257/719; 174/16.3; 165/80.3
(58) Field of Classification Search ............. 361/704, 361/719; 165/80.3, 185; 257/718, 719; 174/16.3
See application file for complete search history.

(56) References Cited

U.S. PATENT DOCUMENTS 6,307,748 B1 * 10/2001 Lin et al. ................... 361/704
6,331,937 B1 * 12/2001 Bartyzel ..................... 361/687
6,475,030 B1 * 11/2002 Chang ........................ 439/557
6,697,256 B1 *  2/2004 Horng et al. ............... 361/704
6,865,083 B1 *  3/2005 Liu ............................. 361/704
7,042,727 B1 *  5/2006 Ulen et al. .................. 361/704

FOREIGN PATENT DOCUMENTS

TW    410992    11/2000
TW    527061    4/2003

* cited by examiner

Primary Examiner—Boris Chervinsky
(74) Attorney, Agent, or Firm—Wei Te Chung

(57) ABSTRACT

A mounting device (10) for mounting a heat sink (20) to a circuit board (40), includes a locking member (16) extending through the heat sink and including a through hole (162) and barbs (172) formed in one end portion thereof for engaging with the circuit board, an operation member (12) including a cylinder (122) and a rod (128) extending from the cylinder into the through hole of the locking member. First and second bumps (178, 179) are formed in the locking member, and a pair of slots (126) is defined in the cylinder for engaging with the first and second bumps at first and second positions respectively. A spring (14) is received in the cylinder, surrounding the rod and compressed between an end of the cylinder and the first bumps. The rod expands the barbs outwardly at the second position and releases the barbs at the first position.

17 Claims, 6 Drawing Sheets

MOUNTING DEVICE FOR HEAT SINK

BACKGROUND OF THE INVENTION

1. Field of the Invention

The present invention relates to mounting devices for heat sinks, and particularly to pin-type mounting devices for mounting heat sinks to circuit boards.

2. Related Art

Electronic devices such as central processing units (CPUs) generate a lot of heat during normal operation. This can deteriorate their operational stability and damage associated electronic devices. Thus the heat must be removed quickly to ensure normal operation. A heat dissipation device is often attached to a top surface of a CPU, to remove heat therefrom. Oftentimes, mounting devices are used to mount the heat dissipation device to the CPU.

FIGS. 6–7 show a conventional mounting device mounting a heat sink 6 to a circuit board 9. The mounting device comprises a pin 1 and a spring 2 surrounding the pin 1. The pin 1 comprises a head 3 formed at a top end thereof, and a taper barb 4 formed at a bottom end thereof. An elongate slot 5 is defined in the barb 4 to divide the barb 4 into two halves. The heat sink 6 defines a plurality of first through holes 7. The circuit board 9 defines a plurality of second through holes 7'. In assembly, the heat sink 6 is placed on an electronic component 8 of the circuit board 9 with the first through holes 7 of the heat sink 6 aligned with the second through holes 7' respectively. The pin 1 extends through the corresponding first and second through holes 7, 7' in a up-to-down direction. In the process of the pin 1 extending through the second through hole 7', the two halves of the barb 4 are compressed. After the barb 4 extends through the second through hole 7', the two halves of the barb 4 return to their original states and abut a bottom surface of the circuit board 9. The spring 2 presses a top surface of the heat sink 6 downwardly and the heat sink 6 is therefore mounted to the heat generating component 8.

However, a large operation force is required to exert on the pin 1 to overcome the elastic force of the barb 4 when the pin 1 is extended through the second through hole 7'. Furthermore, the pin 1 is easy to deflect to wear the heat sink 6 and the circuit board 9 in the through holes 7, 7' in assembly. The size of the through holes 7, 7' therefore increases which results in the pin 1 not capable of firmly attaching the heat sink 6 to the circuit board 9.

SUMMARY OF THE INVENTION

Accordingly, an object of the present invention is to provide a mounting device which can readily and firmly mount a heat sink to a circuit board.

Another object of the present invention is to provide a mounting device which has little damage to a heat sink and a circuit board in using.

To achieve the above-mentioned objects, a mounting device in accordance with the present invention comprises a locking member extending through the heat sink and including a through hole and barbs formed in one end portion thereof for engaging with the circuit board, an operation member comprising a cylinder and a rod extending from the cylinder into the through hole of the locking member. First and second bumps are formed in the locking member, and a pair of slots is defined in the cylinder for engaging with the first and second bumps at first and second positions respectively. A spring is received in the cylinder, surrounding the rod and compressed between one end of the cylinder and the first bumps. The rod expand the barbs outwardly cause the barbs to engage with the circuit board at the second position to and releases the barbs to cause the barbs to disengage from the circuit board at the first position.

Other objects, advantages and novel features of the present invention will be drawn from the following detailed description of a preferred embodiment of the present invention with attached drawings, in which:

DETAILED DESCRIPTION OF THE INVENTION

Figure 1:
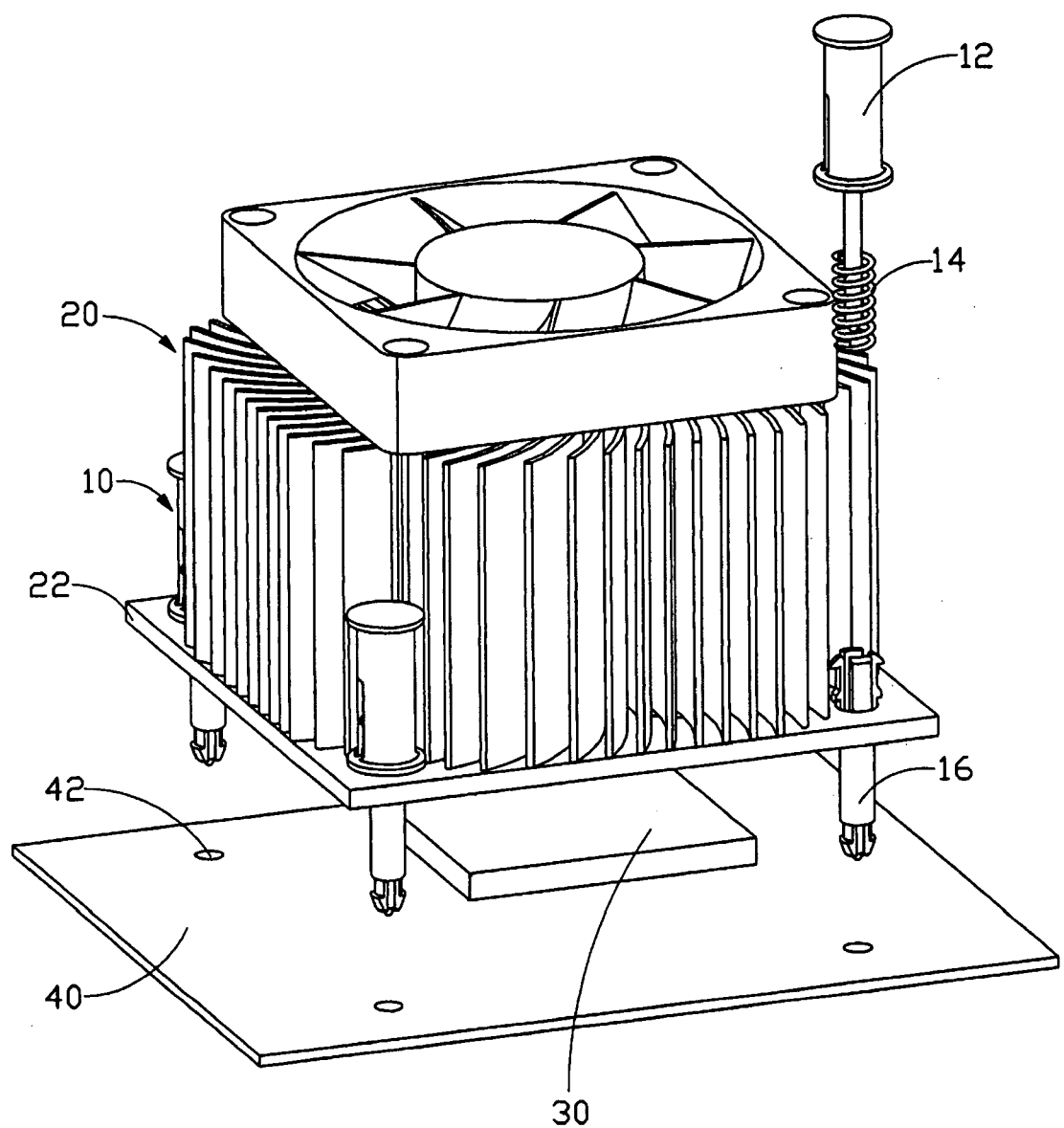
FIG. 1 is a partly assembled view of four mounting devices in accordance with a preferred embodiment of the present invention, a heat sink and a printed circuit board on which a CPU is mounted.

Referring to FIG. 1, a mounting device 10 in accordance with the preferred embodiment of the present invention is used to mount a heat sink 20 to an electronic component 30, such as a central processing unit (CPU) 30 which is attached on a printed circuit board 40. The heat sink 20 comprises a rectangular base 22 defining four through holes 24 in respective four corners thereof (see FIG. 4). The printed circuit board 40 defines four through holes 42 surrounding the CPU 30 and corresponding to the through holes 24 of the heat sink 20.

Figure 2:
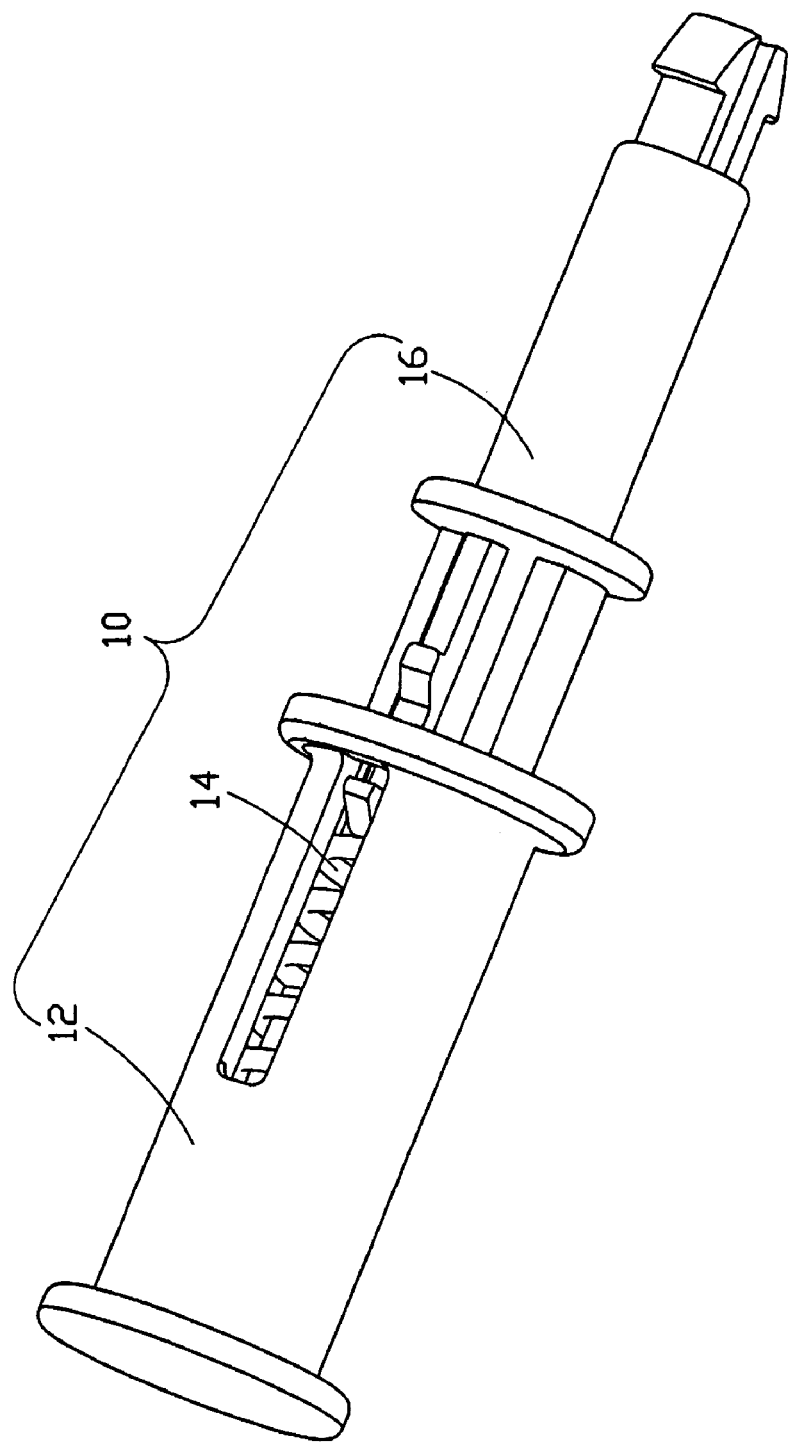
FIG. 2 is an isometric view of one of the mounting devices of FIG. 1.
Figure 3:
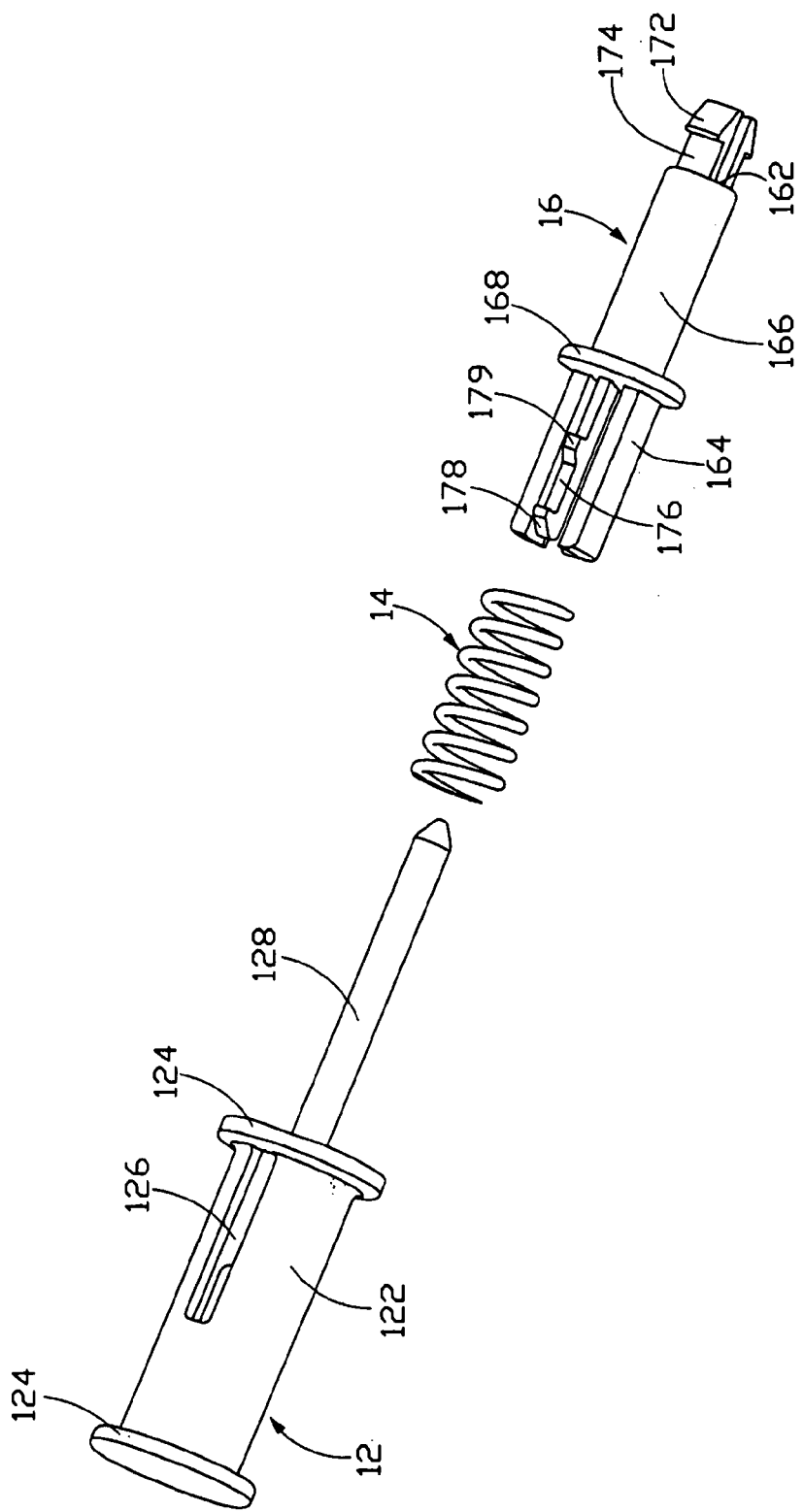
FIG. 3 is an exploded view of the mounting device of FIG. 2.

Referring to FIGS. 2–3, the mounting device 10 comprises an operation member 12, a spring 14, and a pin-type locking member 16. The operation member 12 comprises a hollow cylinder 122 with a pair of flanges 124 formed on opposite first and second ends thereof. A pair of elongate slots 126 is defined in a circumferential wall of the cylinder 122 adjacent to the second flange 124. An elongate rod 128 extends from the first flange 124 through the second flange 124 to the locking member 16. The rod 128 is coaxial with the cylinder 122. The spring 14 is surroundingly attached on the rod 128 and received in the cylinder 122. The locking member 16 defines a through hole 162 extending therethrough and comprises a connection portion 164, a locking portion 166, and a stopping fringe 168 formed between the connection portion 164 and the locking portion 166. The connection portion 164 defines two pairs of slots (not labeled) along a longitudinal direction thereof. A pair of spring arms 176 is therefore formed. Each spring arm 176 forms a first bump 178 at a top end thereof and a second bump 179 at a middle portion thereof. The locking portion 166 defines a neck 174 and a pair of slots (not labeled) in a lower end thereof to therefore form a pair of spaced barbs 172. Each barb 172 has an inverted circumferential surface. One portion of the through hole 162 located in the connection portion 164 has a larger diameter than the other portion of the through hole 162 located in the locking portion 166.

Figure 4:
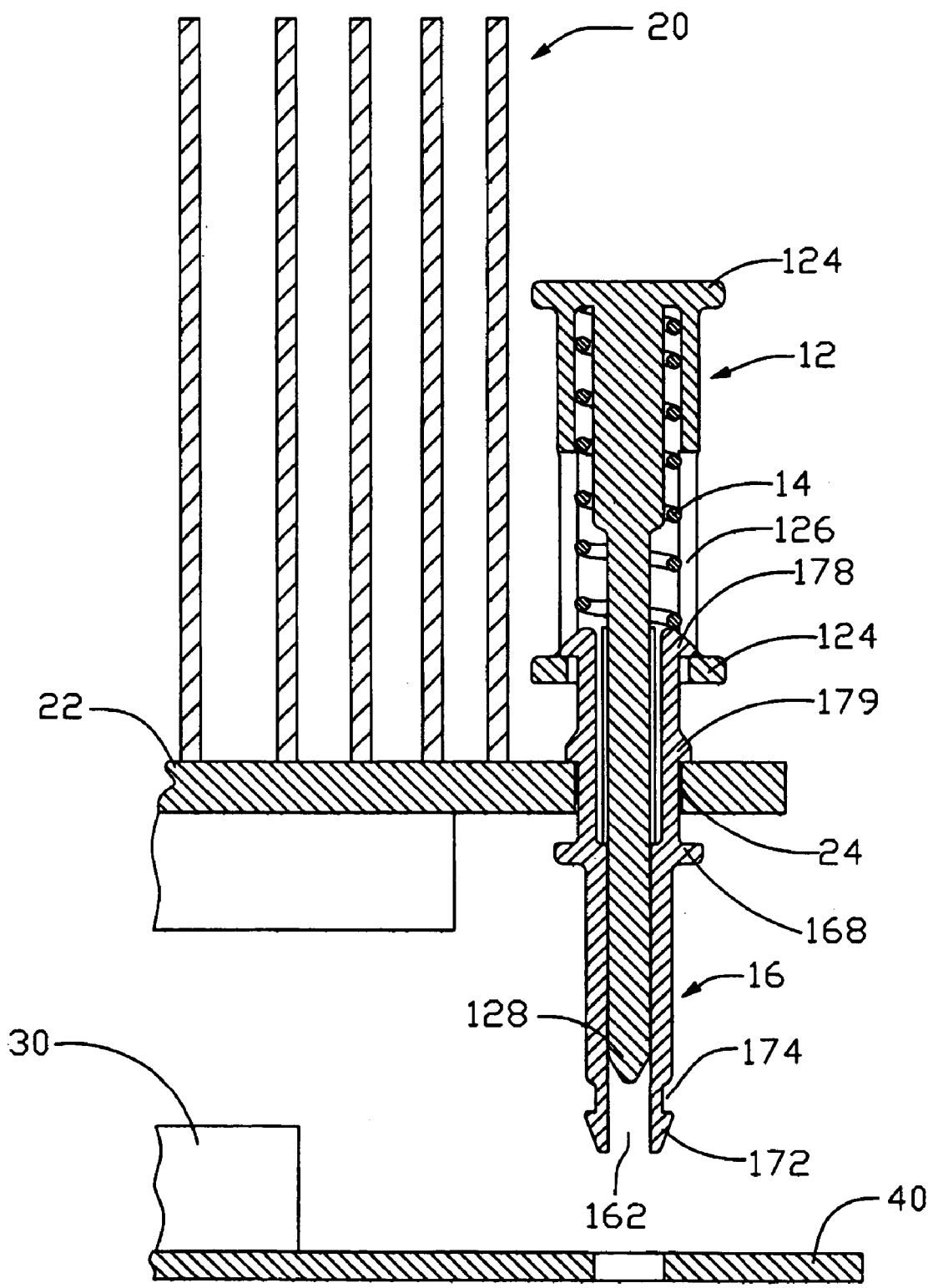
FIG. 4 shows the mounting device of FIG. 2 pre-assembled on the heat sink of FIG. 1.
Figure 5:
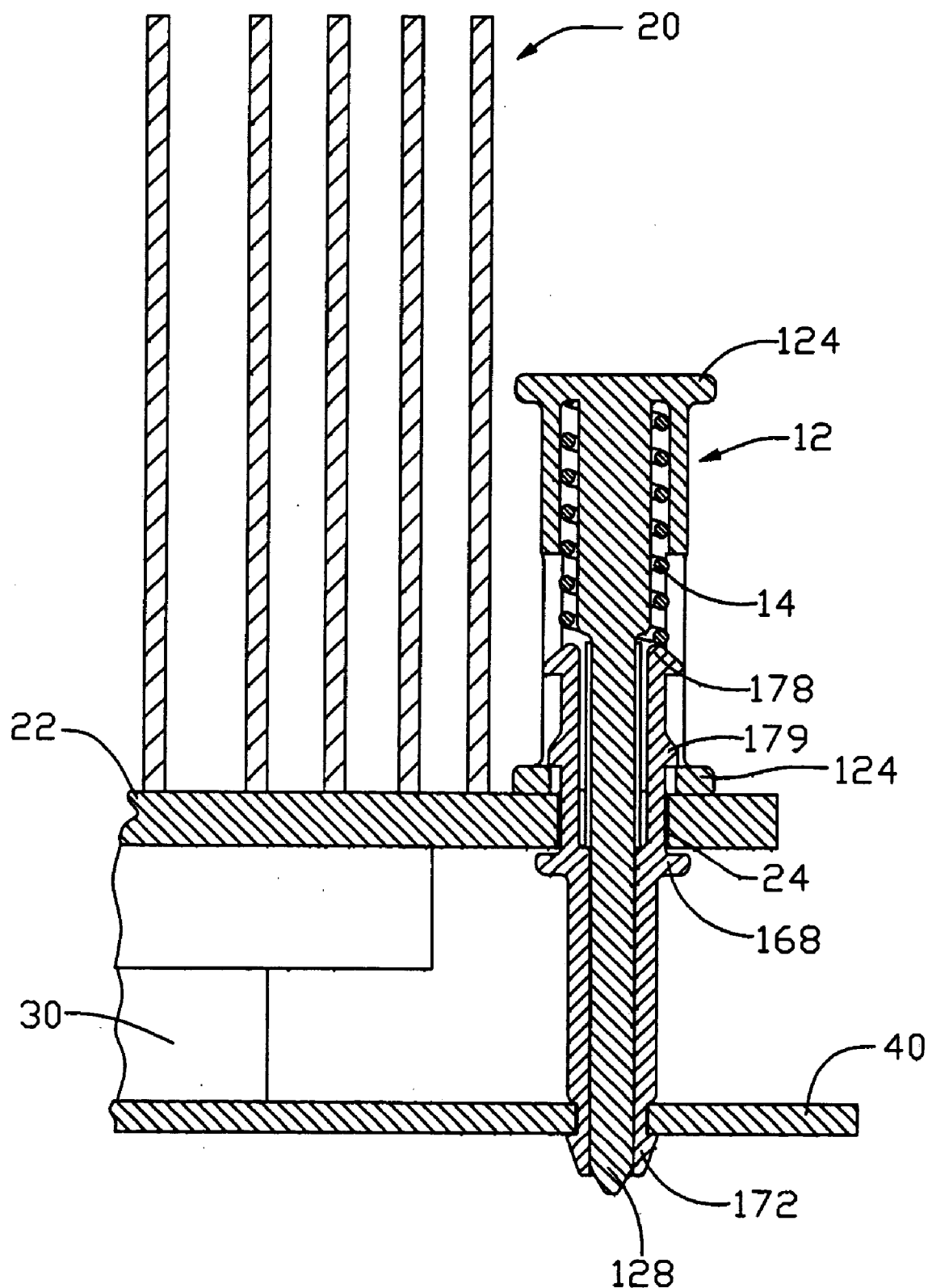
FIG. 5 shows the mounting device of FIG. 2 mounting the heat sink to the printed circuit board.
Figure 6:
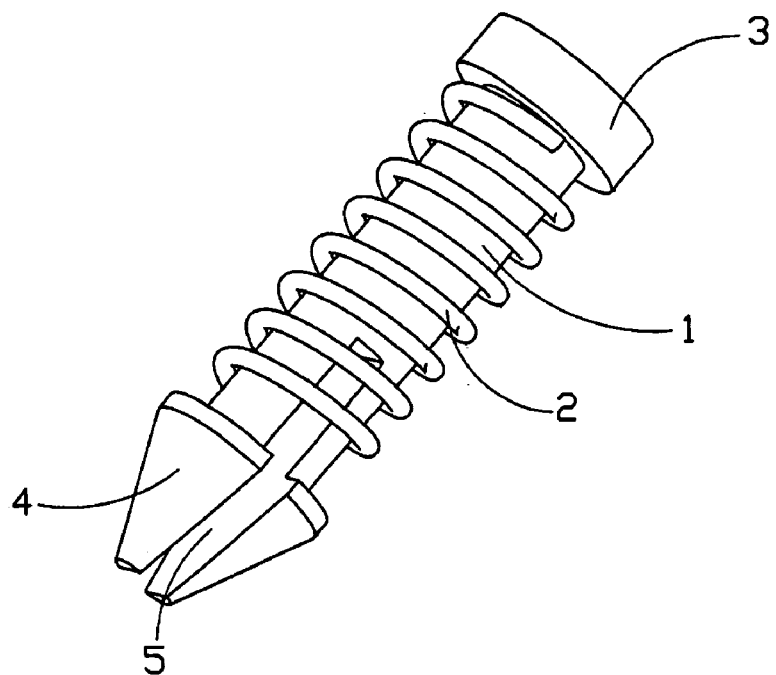
FIGS. 6–7 show a conventional mounting device mounting a heat sink to a printed circuit board.
Figure 7:
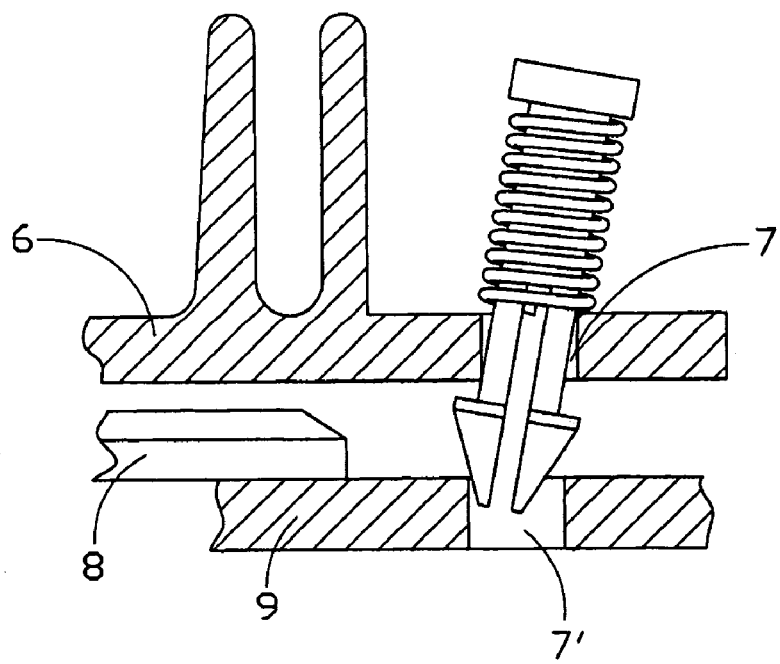

Referring to FIGS. 4–5, in assembly, the connection portion 164 of the locking member 16 of the mounting device 10 extends through a corresponding through hole 24 of the base 22 of the heat sink 20 in a down-to-up direction until the second bumps 179 of the connection portion 164 abut a top surface of the base 22. The rod 128 of the operation member 12 extends downwardly into the through hole 162 of the locking member 16 to cause the connection portion 164 of the locking member 16 to be received in the slots 126 of the cylinder 122 of the operation member 12. The spring 14 is compressed between the first bumps 178 and the second flange 124 and presses the locking member 16 downwardly to cause the first bumps 178 of the locking member 16 to abut the second flange 124 of the operation member 12 in the corresponding slots 126. The stopping fringe 168 can prevent the mounting device 10 from sliding upwardly off from the base 22 via the through hole 24. The mounting device 10 is thus pre-assembled to the heat sink 20. The remained mounting devices 10 are pre-assembled to the heat sink 20 in the same way. The combined heat sink 20 and mounting devices 10 is then placed on the printed circuit board 40 with the heat sink 20 seated on the CPU 30 and the barbs 172 extending through the corresponding through holes 42 of the printed circuit board 40. The operation members 12 are downwardly pushed until the second flanges 124 slide over the second bumps 179 of the locking members 16. The second bumps 179 are therefore engaged in the corresponding slots 126 of the operation member 12. The rods 128 of the operation members 12 expand the pair of barbs 172 outwardly to cause the barbs 172 to firmly engage with the printed circuit board 40 in the necks 174. The second flanges 124 of the operation members 12 bear against the base 22 of the heat sink 20. The heat sink 20, the CPU 30, and the printed circuit board 40 are secured between the second flanges 124 of the operation members 12 and the barbs 172. Thus, the heat sink 20 is thus firmly attached on the CPU.

In disassembly, the spring arms 176 of the locking member 16 are squeezed to cause the second bumps 179 to disengage from the corresponding slots 126 of the operation member 12. At the same time, the operation member 12 are pulled upwardly to draw the rod 128 upwardly until the rod 128 locates above the circuit board 40. The barbs 172 are released from the rod 128 and therefore disengage able from the circuit board 40. The mounting device 10 can then be readily detached from the circuit board 40.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A mounting device for mounting a heat sink to a circuit board, the mounting device comprising:
a locking member comprising a through hole and barbs formed at one end portion thereof for engaging with the circuit board;
an operation member comprising a rod extending into the through hole of the locking member and being movable between first and second positions; and
means for engaging the operation member and the locking member at said firm and second positions, wherein
one end of the rod expands the barbs outwardly at said second position and releases the barbs at said first position, and wherein
the engaging means comprises a pair of first bumps and a pair of second bumps formed in one of the operation member and the locking member, and a pair of slots formed in the other of the operation member and the locking member, the first bumps engaging in corresponding slots at said first position and the second bumps engaging in corresponding slots at said second position.

2. The mounting device as claimed in claim 1, wherein the operation member further comprises a hollow cylinder, and wherein the slots are defined in a circumferential wall of the cylinder and an opposite end of the rod extends into the cylinder.

3. The mounting device as claimed in claim 2, wherein the locking member further comprises a connection portion comprising a pair of spring arms on which the first and second bumps are formed.

4. The mounting device as claimed in claim 2, wherein the engaging means further comprises a spring surrounding an opposite ends of the rod in the cylinder and compressed between one end of the cylinder and the first bumps.

5. The mounting device as claimed in claim 2, wherein the locking member is movable relative to the operation member in the cylinder, the slots of the cylinder are selectively engagable with the first bumps and the second bumps to engage the operation member end the locking member at the first position and the second position, respectively.

6. The mounting device as claimed in claim 4, wherein when a force is radially exerted on the second bumps at the second position, the rod is driven to move towards the first position by the spring.

7. A mounting device assembly comprising:
a circuit board having an electronic component mounted thereon;
a heat sink positioned on the electronic component, the heat sink comprising a base; and
at least two mounting device for mounting the heat sink to the circuit board, each mounting device comprising:
a locking member comprising a connection portion extending through the base and a looking portion;
an operation member comprising a hollow cylinder located above the base and a rod extending though the hollow cylinder and the connection portion of the locking member to the locking portion; and
means for engaging the operation member and the locking member at first and second positions, the engaging means being formed between the hollow cylinder of the operation member and the locking member, wherein
the rod extends through the circuit board and the locking portion is engaged with the circuit board at said second position and the rod locates above the circuit board and the locking portion is disengaged from the circuit board at said first position.

8. The mounting device assembly as claimed in claim 7, wherein the engaging means comprises a pair of first bumps and a pair of second bumps formed at one of the operation member and the locking member, and a pair of slots formed in the other of the operation member and the locking member, the first bumps engaging in corresponding slot at said first position and the second bumps engaging in corresponding slots at said second position.

9. The mounting device assembly as claimed in claim 8, wherein the slots are defined in a circumferential wall of the cylinder and the rod extends from one end of the cylinder through an opposite end of the cylinder.

10. The mounting device assembly as claimed in claim 8, wherein the connection portion comprises a pair of spring arms on which the first and second bumps are formed.

11. The mounting device assembly as claimed in claim 10, wherein the engaging means further comprises a spring surrounding the rod in the cylinder and compressed between said one end of the cylinder and the first bumps.

12. The mounting device assembly as claimed in claim 10, wherein the locking member further comprises a stopping fringe located below the base of the heat sink for preventing the mounting device from sliding off from the heat sink.

13. The mounting device assembly as claimed in claim 8, wherein the circuit board defined through holes at which the locking members engage with the circuit board.

14. The mounting device assembly as claimed in claim 7, wherein the connection portion of the locking member and the engaging means are movably received in the hollow cylinder of the operation member.

15. A heat dissipation device assembly comprising:
- a printed circuit board having a heat generating device thereon and defining a first through hole therein;
- a heat sink positioned upon the heat generating device and defined therein a second through hole in alignment with said first through hole;
- a mounting device fastening said heat sink and said printed circuit board together, said mounting device including:
- a locking member defining a locking hook at a bottom end thereof to protrude through the first through hole and latchably engage the printed circuit board; and
- an operation member pre-assembled to the locking member and extending through the second through hole; wherein
- said operation member is selectively located at upper relaxed and lower locked positions relative to the locking member for attachment of the heat sink to the printed circuit board; and wherein
- said locking member defines upper and lower sections to respectively engaged with a same portion of said operation member to determine said upper relaxed and lower locked positions of the operation member relative to the locking member.

16. The heat dissipation deice assembly as claimed in claim 15, wherein a resilient member is compressed between the operation and the locking member to hole the operation member in position either in the upper relaxed position or the lower locked position.

17. The heat dissipation deice assembly as claimed in claim 15, wherein said locking member extends through said second through hole.

* * * * *